(12) United States Patent
Ogatsu (10) Patent No.: US 9,104,066 B2
(45) Date of Patent: Aug. 11, 2015

(54) PORTABLE DEVICE WITH DISPLAY UNIT WITH PARTICULAR METAL STRUCTURE AND INJECTION MOLDED CASING

(75) Inventor: Toshinobu Ogatsu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 12/064,685

(22) PCT Filed: Aug. 23, 2006

(86) PCT No.: PCT/JP2006/316477
§ 371 (c)(1),
(2), (4) Date: Feb. 25, 2008

(87) PCT Pub. No.: WO2007/023846
PCT Pub. Date: Mar. 1, 2007

(65) Prior Publication Data
US 2009/0268120 A1    Oct. 29, 2009

(30) Foreign Application Priority Data
Aug. 25, 2005    (JP) .................. 2005-244813

(51) Int. Cl.
*G02F 1/1333*    (2006.01)
*G02F 1/1335*    (2006.01)
(Continued)

(52) U.S. Cl.
CPC .... *G02F 1/133608* (2013.01); *G02F 1/133615* (2013.01); *H04M 1/0202* (2013.01);
(Continued)

(58) Field of Classification Search
CPC ............... G02F 1/133615; G02F 1/133608; H04M 1/0266; H04M 1/185; H05K 5/04; H05K 5/0017

USPC ........................... 349/58; 361/679.3
See application file for complete search history.

(56) References Cited

U.S. PATENT DOCUMENTS 4,852,736 A * 8/1989 Kojima et al. ................ 235/1 D
5,570,267 A   10/1996 Ma
(Continued)

FOREIGN PATENT DOCUMENTS

EP    0 641 643 A2    3/1995
EP    1 376 208 A1    1/2004
(Continued)

OTHER PUBLICATIONS

Extended European Search Report issued for corresponding EP Application 13162919.8.
(Continued)

*Primary Examiner* — Michael Caley
(74) *Attorney, Agent, or Firm* — Arent Fox LLP (57) ABSTRACT

There is provided a metal structure that holds the display unit, as the main structure, and a casing structure that is integrally molded from resin onto the metal structure. The metal structure is resilient against flexural loads, torsional loads, and other deformations from the exterior upon the display unit composed of thin plate glass, because the member that protects the display unit is in a box shape. The display unit itself can be protected from damage even if rigidity is reduced because of a thinner profile. The metal structure is manufactured by thin plate pressing and sufficient strength can be maintained even if the thickness is low. Furthermore, the metal structure is configured as a frame part of the entire casing, the rigidity of the entire device can therefore be maintained by using this structure, and the mounting board and functional components other than the display unit can also be protected.

16 Claims, 12 Drawing Sheets (51) Int. Cl.
   *H04M 1/02*   (2006.01)
   *H04M 1/18*   (2006.01)
   *H05K 5/00*   (2006.01)
   *H05K 5/04*   (2006.01)

(52) U.S. Cl.
   CPC ............ *H04M1/0266* (2013.01); *H04M 1/185* (2013.01); *H05K 5/0017* (2013.01); *H05K 5/0086* (2013.01); *H05K 5/04* (2013.01)

(56) References Cited

U.S. PATENT DOCUMENTS

| | | |
|---|---|---|
| 6,388,722 B1 | 5/2002 | Yoshii et al. |
| 6,392,724 B2 | 5/2002 | An et al. |
| 8,558,962 B2 | 10/2013 | Ogatsu |
| 2002/0003591 A1* | 1/2002 | Giannatto ................... 349/58 |
| 2002/0081115 A1* | 6/2002 | Suzuki et al. ............... 396/429 |
| 2002/0113918 A1 | 8/2002 | Hiratsuka et al. |
| 2002/0158999 A1* | 10/2002 | Shima ........................ 349/58 |
| 2003/0128307 A1* | 7/2003 | Ito et al. ..................... 349/58 |
| 2003/0160909 A1 | 8/2003 | Wang |
| 2004/0114318 A1 | 6/2004 | Nuovo et al. |
| 2004/0189889 A1* | 9/2004 | Nitto et al. .................. 349/58 |
| 2005/0037215 A1 | 2/2005 | Ishiduka et al. |
| 2005/0063170 A1 | 3/2005 | Lee et al. |
| 2005/0073622 A1 | 4/2005 | Kitaka et al. |
| 2005/0196123 A1* | 9/2005 | Kumagai ..................... 385/146 |
| 2005/0280750 A1* | 12/2005 | Cho et al. ................... 349/58 |
| 2005/0285991 A1 | 12/2005 | Yamazaki |
| 2006/0061859 A1 | 3/2006 | Chen et al. |
| 2006/0146223 A1* | 7/2006 | Iwai et al. .................. 349/58 |
| 2009/0004408 A1* | 1/2009 | Nakanishi et al. .......... 428/12 |

FOREIGN PATENT DOCUMENTS

| | | |
|---|---|---|
| JP | 2000-114742 A | 4/2000 |
| JP | 2000-223855 A | 8/2000 |
| JP | 2001-168554 A | 6/2001 |
| JP | 2002-051132 A | 2/2002 |
| JP | 2002-225073 A | 8/2002 |
| JP | 2003-258446 A | 9/2003 |
| JP | 2004-228238 A | 8/2004 |
| JP | 2004-317588 A | 11/2004 |

OTHER PUBLICATIONS

Extended European Search Report issued for corresponding EP Application 13162928.9.

* cited by examiner

PORTABLE DEVICE WITH DISPLAY UNIT WITH PARTICULAR METAL STRUCTURE AND INJECTION MOLDED CASING

TECHNICAL FIELD

The present invention relates to a portable phone or another portable device having a display unit, and particularly relates to an improvement of a casing structure for protecting the display unit and increasing strength in conjunction with smaller, thinner devices.

BACKGROUND ART

There is a strong demand for portable phones having a camera function, a larger screen, and other advanced functions, due to expanded needs for the functions. On the other hand, there is also a strong demand for a smaller, thinner profile from the viewpoint of portability. Various structures have been adopted to respond to these contradictory demands. The casing structure that is used on portable phone terminals generally has a housing in which a plurality of resin or metal components are loosely fitted and affixed using pawls or the like, affixed by screws, sandwiched, or held via another method. Alternatively, these methods may be used in combination. There are also cases in which a cushion or the like is affixed so that deformations in the outer casing are not transmitted to the interior. On the other hand, portable phones are exposed to various load conditions such as being subjected to bending loads, as in instances of being unintentionally dropped when carried, being pocketed and sat upon when the user sits in a chair and the like, or being pressed by books and the like when in a briefcase. Display units typified by liquid crystals are ordinarily made of glass, and it is important to ensure the strength of a casing structure because it cannot be that the display unit can withstand these types of loads. For this reason, in order to ensure the strength of the resin casing, the thickness of the walls may be increased, or, when the liquid crystal display unit is enlarged, a specialty frame part may be added or the frame part may be additionally composed of metal, as is described in Patent Document 1. Additionally, a structure may be adopted using a metal frame composed of magnesium alloy and the like, as is described in Patent Documents 2 and 3.

Patent Document 1: Japanese Laid-Open Patent Application No. 2004-317588
Patent Document 2: Japanese Laid-Open Patent Application No. 2002-51132
Patent Document 3: Japanese Laid-Open Patent Application No. 2000-114742

DISCLOSURE OF THE INVENTION

Problems the Invention is Intended to Solve

However, there are a number of problems in the casing structures disclosed in these patent documents.

The first problem is that even if a fiber reinforced resin or another resin material having a high modulus of elasticity is used in the liquid crystal holding member, the modulus of elasticity of the resin is low in comparison with ferrous metals, having only $1/50^{th}$ to $1/70^{th}$ the elasticity of the metals, and the thickness must be increased in order to ensure the strength. As a result, the need for a smaller, thinner profile cannot be met.

The second problem is that of fluidity during molding when resin molding is used. A prescribed thickness or greater must be assured, and there is a limit to making the device thinner.

The third problem is that a certain thickness becomes necessary for molding even with the use of excellent molding methods such as thixotropic molding conducted using magnesium alloys and the like. For this reason, an insufficient contribution is made to achieving a thinner profile, even if the method is excellent for ensuring strength.

The fourth problem is that although sufficient strength can be assured when a metal frame is used and the frame of the liquid crystal portion is composed of a different component, such an approach is unsuitable for achieving a smaller, thinner profile because the frame member itself must have a certain thickness. Furthermore, screw clamps, pawl fasteners, and other connecting regions between the metal frame and a resin casing become essential, and, as a result, there is a limitation to making the profile smaller and thinner.

The fifth problem is that an adhesive surface area must be assured, and this is an impediment to achieving a smaller, thinner profile even if the resin and metal are bonded together using an adhesive agent in order to solve the fourth problem.

The sixth problem is that in the mode shown in Patent Document 3, the resin and the magnesium casing components come apart easily when the bonding surface area is small, as shown in FIGS. 3, 6 and 7. For this reason, a bonding surface area between the resin and the magnesium casing portion must be designed to be as large as possible. For this reason, the thickness of the metal components cannot be reduced, the shape becomes complicated, and other drawbacks occur.

The present invention was contrived in view of the foregoing problems, and an object thereof is to provide a portable device having a display unit provided with a casing that can protect the display unit and that has a structure that is suitable for a smaller and thinner profile.

Means for Solving the Problems

A portable device having a display unit according to a first aspect of the present invention is characterized in having a metal structure composed of a molded article in the form of a bottomed concave-shaped metal plate, which has contiguous side walls for holding the display unit; and a framed-shaped resin casing injection molded onto the surface of the metal structure and integrally formed with the metal structure; a casing being composed of the metal structure and the resin casing.

It is preferred that the metal structure in the portable device have a rib structure along the bottomed concave-shaped part. The rigidity of the casing is thereby increased.

It is preferred that the metal structure be formed by drawing a thin metal plate, and the side wall surfaces of the bottomed concavity shape be contiguous.

It is also preferred that the metal structure be formed by, e.g., sintering or precision casting, including injection molding.

It is also preferred that the resin casing be exposed on an exterior surface. The casing can achieve high design characteristics by resin molding in relation to the exterior, while maintaining a thin profile and high rigidity.

It is further preferred that the resin casing at a hinge area and vicinity thereof be molded using highly elastic resin material. In this way, both protection of internal components and less plastic deformation of the casing can be ensured.

For example, the display unit is a backlit liquid crystal, the flat bottom surface of the bottomed concave-shaped part that holds the display unit of the metal structure is composed of a mirror finish section, and the mirror finish section doubles as a reflecting plate of the liquid crystal backlight.

It is further preferred that the rib structure portion of the metal structure have a drawn part that is drawn into a cross-sectional concave shape. Deformations of the display unit in the vicinity of the hinge can thereby be reduced.

In this way, the present invention is composed of a metal structure that holds the display unit, as the main structure, and a casing structure that is integrally molded from resin onto the metal structure. The metal structure is resilient against flexural loads, torsional loads, and other deformations from the exterior upon the display unit composed of thin plate glass, because the member that protects the display unit is in a box shape. The display unit itself can be protected from damage even if rigidity is reduced because of a thinner profile. The metal structure is manufactured by thin plate pressing, and sufficient strength can be maintained even if the thickness is low. Furthermore, the rigidity of the entire device can be maintained by using this structure because the structure is the frame portion for the entire casing, and the mounting board and functional components other than the display unit can be protected. Furthermore, a variety of designs can be implemented in the same manner as an apparatus having a conventional configuration because the metal structure is internally constituted and the exterior portion is composed of resin. Plastic deformation of the metal can be reduced by combining a metal portion having a narrow range of elastic deformation and a resin component having a wide range of elastic deformation.

A portable device having a display unit according to another aspect of the present invention is characterized in having a metal structure composed of a molded article in the form of a bottomed concave-shaped metal plate that has contiguous side walls for holding the display unit, and a framed-shaped metal casing injection molded onto the surface of the metal structure and integrally formed with the metal structure, a casing being composed of the metal structure and the metal casing.

In the portable device having a display unit, the metal casing can be molded by metal injection molding, which includes thixotropic molding or die casting; and can be composed so that the coefficient of thermal expansion of the metal material to be molded is less than the coefficient of thermal expansion of the metal structure.

Effect of the Invention

In accordance with the present invention, the display unit can be protected, the rigidity characteristics of the casing can be improved, and a smaller thinner profile can be achieved. Furthermore, design characteristics can be assured by molding the exterior from a resin while maintaining a thin profile and high rigidity. Also, plastic deformations that readily occur when a metal casing is used can be kept to a minimum.

KEY

100: metal structure
101: display unit holding section
102: cable aperture
103: rib
104: aperture
105: coupling hole
106: notch
107: holding pawl
108: aperture
109: drawn member
110: cutaway section
111: cut section
200: resin casing
201: rib
202: speaker sound hole
203: hinge area
204: screw hole
300: rear cover
301: rib
302: display opening
400: main display unit
500: mount board
501: rear surface protective screen opening
600: protective screen
700: rear surface display unit
800: rear surface protective screen
900: fastening screw

BEST MODE FOR CARRYING OUT THE INVENTION

Figure 1:
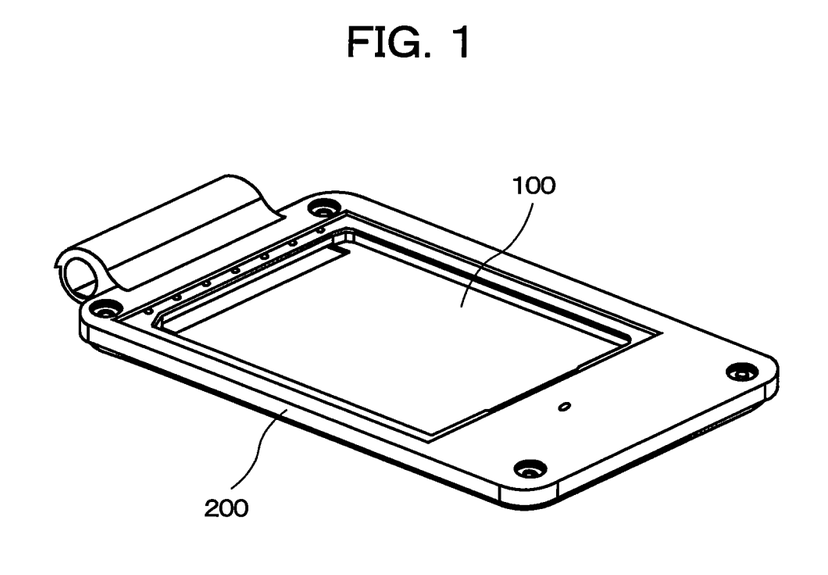
FIG. 1 is a perspective view showing the casing structure of the portable device according to an embodiment of the present invention.
Figure 2:
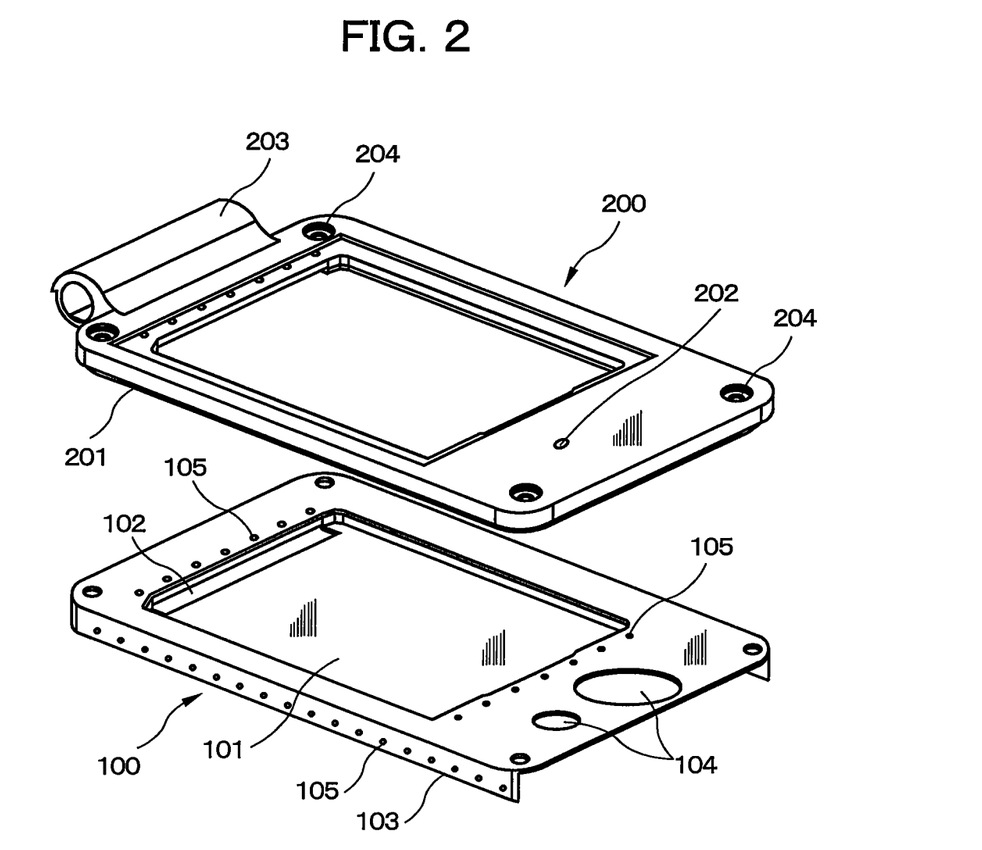
FIG. 2 is an exploded perspective view in which the metal structure 100 shown in FIG. 1 is detached.
Figure 3:
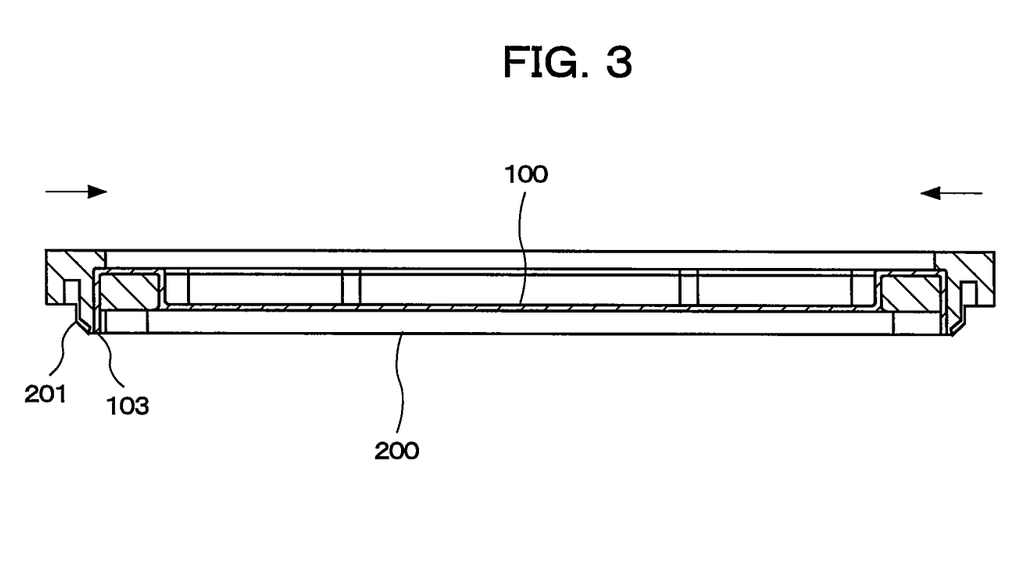
FIG. 3 is a cross-sectional view of the metal structure 100.
Figure 4:
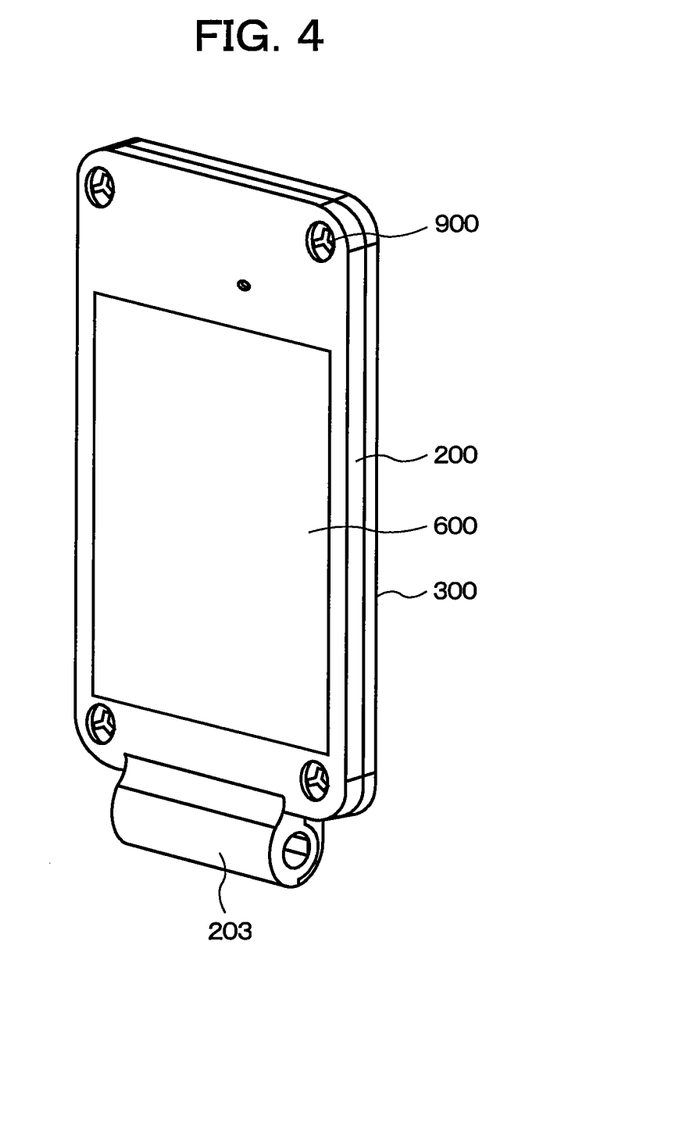
FIG. 4 is a perspective view of a folding version of the portable device after the display unit has been assembled.
Figure 5:
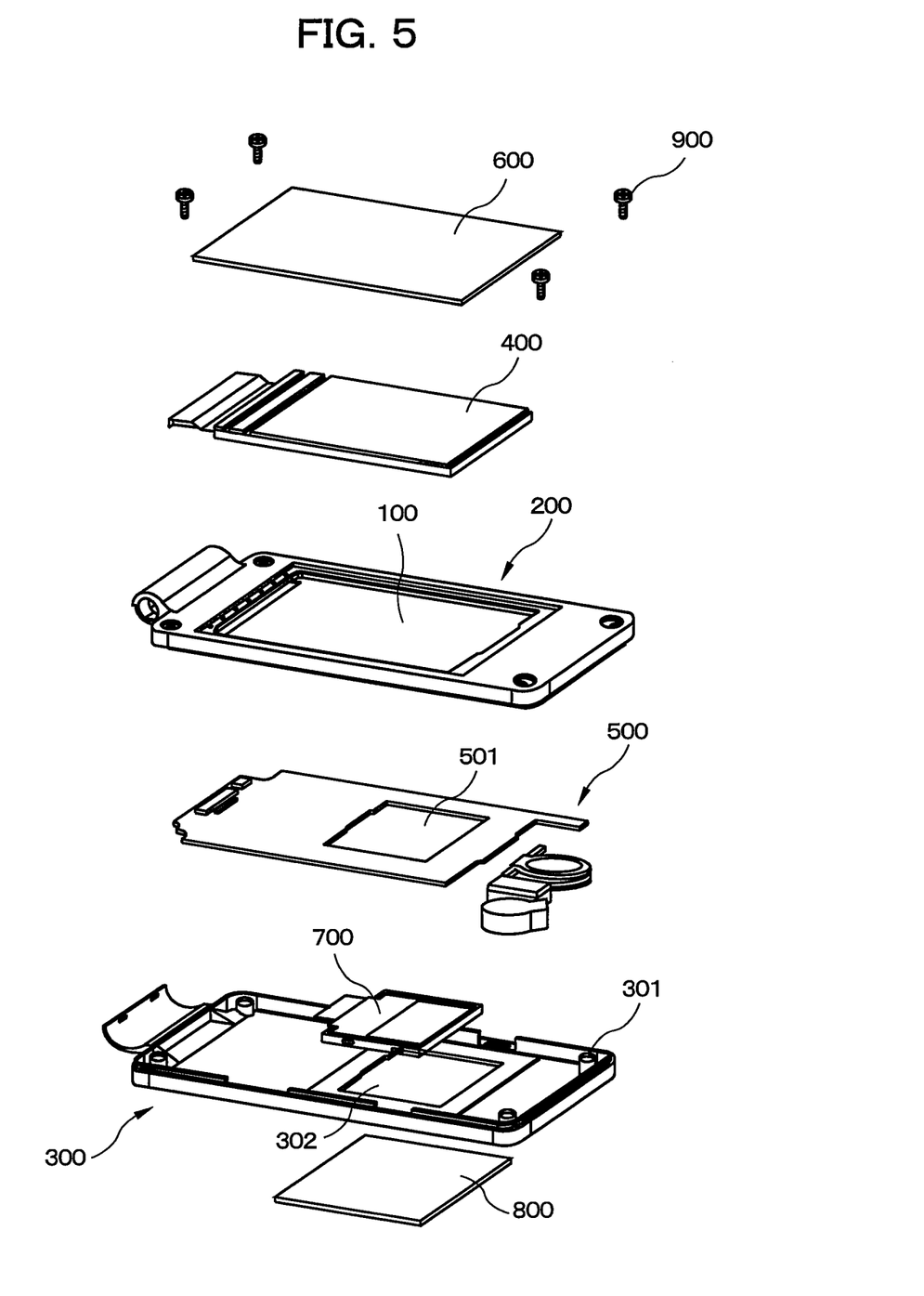
FIG. 5 is an exploded perspective view of FIG. 4.
Figure 6:
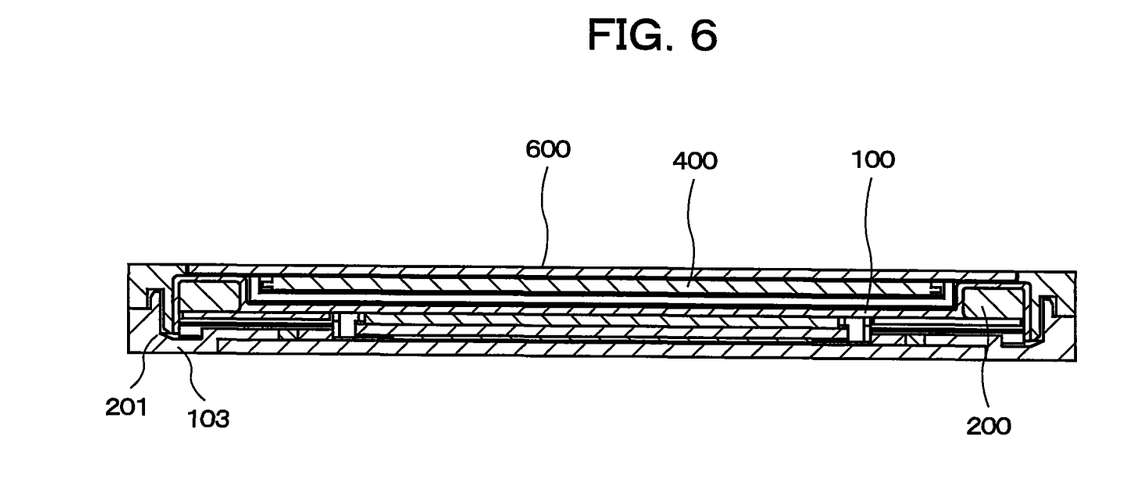
FIG. 6 is a cross-sectional view of FIG. 4.

Next, embodiments of the present invention will be described in detail with reference to the diagrams. FIG. 1 is a perspective view showing the casing structure of the portable device having a display unit according to the embodiments of the present invention. FIG. 2 is an exploded perspective view in which the metal structure 100 shown in FIG. 1 is detached. FIG. 3 is a cross-sectional view of the metal structure 100. FIG. 4 is a perspective view of a folding version of the portable device after the display unit has been assembled. FIG. 5 is an exploded perspective view of FIG. 4. FIG. 6 is a cross-sectional view of FIG. 4.

The metal structure 100 has a display unit holding section 101 for holding a liquid crystal or other display unit, a cable aperture 102 through which a flexible cable of the display unit is passed, a rib 103 for maintaining flexural rigidity in the lengthwise direction of the liquid crystal, and holes 104 for a speaker and a receiver, as shown in FIGS. 1 and 2. The metal structure 100 is formed by press working using a thin plate composed of stainless steel having a thickness of approximately 0.2 mm to 0.4 mm. The metal structure 100 is preferably formed using a steel material having considerable elastic deformation, which is referred to as spring material, in order to reduce in-service plastic deformation. The display unit holding section 101 is formed by drawing and has considerable flexural and torsional rigidity.

A frame-shaped resin casing 200 is integrally formed with the metal structure 100. In other words, the resin casing 200 is formed integrally with the metal structure 100 by injection molding so as to surround the entire metal structure 100. At this time, the metal structure 100 is provided with very small coupling holes 105, and resin enters into the coupling holes 105 in order to connect the metal plate of the metal structure 100 and the resin covering member of the resin casing 200. After this integral formation, the resin casing 200 and the metal structure 100 are cooled, and are therefore caused to undergo thermal contraction, but the metal structure 100 shrinkage is far less than that of the resin shrinkage. For this reason, deformation often occurs.

However, the metal structure 100 in the present invention is designed in a box shape and the stand-alone hardness of the metal structure is much higher than that of the resin casing 200. Furthermore, deformations from shrinkage can be cancelled out by making the resin casing 200 that covers the outer surface of the metal structure uniform in thickness. In the lengthwise direction, in which a load tends to be applied, plastic deformation of the metal can be kept to a minimum due to the elasticity of the resin via the resin ribs on both sides along the metal structure 100. The hinge peripheral area is composed of the resin casing and can absorb shock energy without undergoing plastic deformations due to shock loads.

The resin casing 200 is provided with a speaker sound hole 202, and a rib 201 for fitting and fastening a rear cover 300. Moreover, formed on the resin casing are a hinge member 203 for making a connection to the lower casing, and screw holes 204 for fastening the rear cover. Ribs 301 (see FIG. 5) for fitting the resin casing 200 are provided to the rear cover 300, and a rear surface display opening 302 is punched therein. The rear cover 300 may be made of resin molding material or may be made of metal in order to obtain a thinner profile. Alternatively, the two may be integrally formed.

The method of assembling the portable device having a display unit according to the embodiments of the present invention will be described next with reference to FIG. 5. First, a main display unit 400 is mounted in the resin casing 200 that is integrally formed with the metal structure 100. The wiring of the display unit 400 is connected to a mount board 500 via the cable aperture 102. A protective screen 600 is applied to the resin casing 200 and the front surface of the main display unit 400. Also, a rear surface display unit aperture 501 is provided to the mount board 500, and a rear surface display unit 700 is disposed in the position of the rear surface display unit aperture 501. A rear surface protective screen 800 of the rear surface display unit 700 is bonded to the rear cover 300. The rear cover 300 and the resin casing 200 are brought together, and the rear cover 300 is fitted to the resin casing 200, and the two are fastened using fastening screws 900.

A reflecting plate component must be added in order to efficiently reflect the light of a backlight light guide plate when the main display unit 400 is a backlit liquid crystal, but in the present invention, the reflective portion is a thin stainless steel plate, and a reflecting plate is rendered unnecessary by using a stainless steel material that has been polished in advance to a mirror finish.

The metal structure 100 of the present invention readily undergoes plastic deformation because the elastic range is narrow for ordinary press material. On the other hand, material having high spring characteristics is not suitable for precision pressing, which includes drawing, because the molding characteristics of the material are compromised by the high spring characteristics. In the present invention, the shape of the metal structure is simplified, whereby a material endowed with greater spring characteristics than ordinary material can be used. By using this solution, the elasticity range of the metal structure 100 is increased, the necessity of using a resin material having the required high modulus of elasticity is eliminated, and options in choosing resin materials are increased.

In such a portable device, the minimum thickness is determined by the sum of the thickness of the devices of the display portion, the thickness of the protective screen, the gap between the protective screen and the display unit, the thickness of the display unit, the thickness of the casing, the thickness of the rear surface display unit, the thickness of the rear surface protective screen, and the gap between the rear surface protective screen and the rear surface display unit. However, if the thickness of each component is reduced, the strength will be reduced in proportion to the cube of the thickness, unless materials are changed. The thickness and strength of the casing portion in the present invention are selected so that the thickness is 0.5 times and the strength ratio is 6 to 8 times of those achieved when the surface of the holding portion of the display unit is made of resin, and the thickness is 0.6 times and the strength ratio is approximately 1.2 times in comparison with a magnesium alloy. Furthermore, since the folding portion has strength, the same level or greater level of strength can be assured in comparison with a conventional resin structure, even if the thickness of the device is halved.

Figure 7:
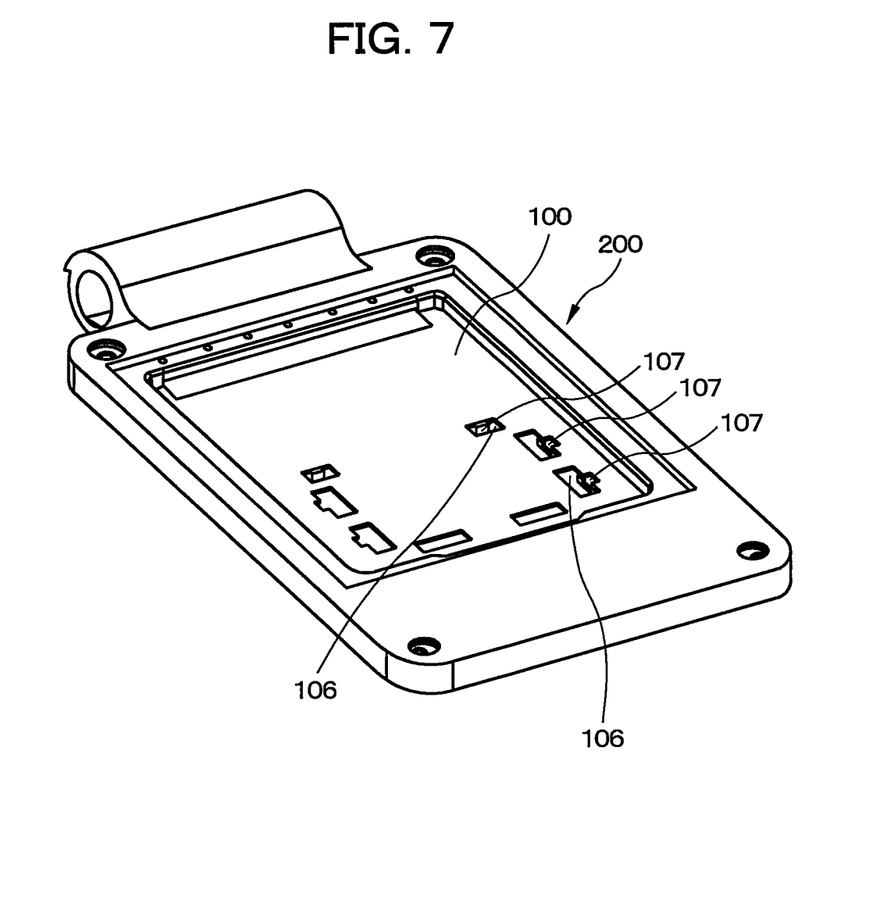
FIG. 7 is a perspective view showing the casing structure of the portable device according to a second embodiment of the present invention.
Figure 8:
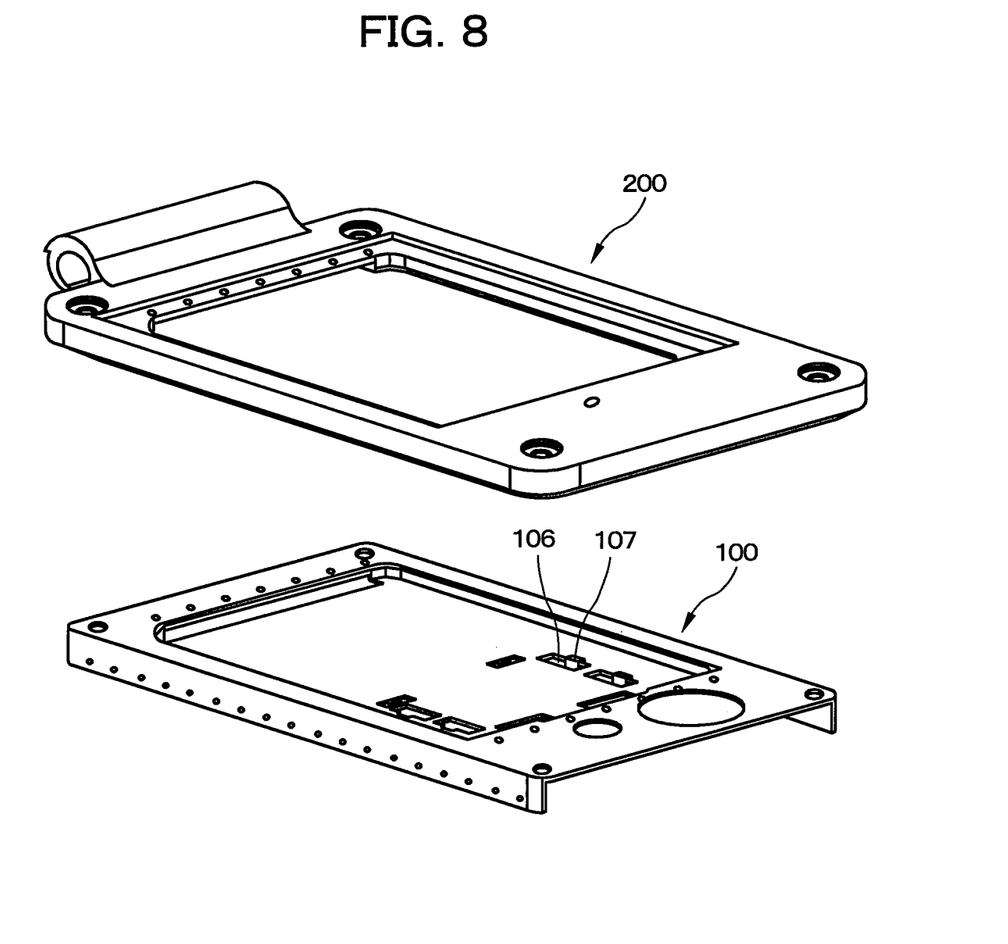
FIG. 8 is an exploded perspective view of FIG. 7.
Figure 9:
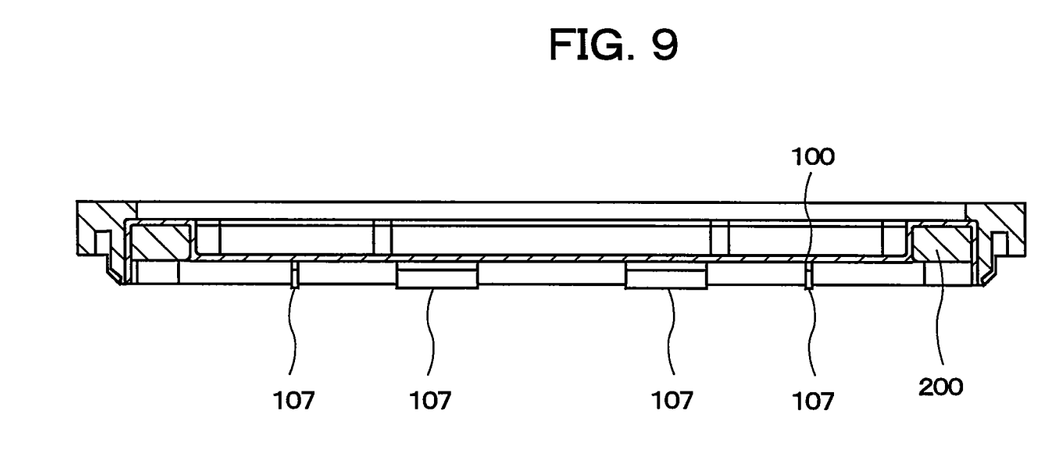
FIG. 9 is a cross-sectional view of FIG. 7.

FIG. 7 is a perspective view showing a second embodiment of the portable device of the present invention. FIG. 8 is an exploded perspective view of FIG. 7. FIG. 9 is a cross-sectional view. Rectangular-shaped notches 106 are provided by thin plate pressing along the four sides of the outside periphery of the rear surface display unit, and holding pawls 107 that hold the rear surface display unit 700 are formed inside the notches 106. The rear surface display unit 700 can be held by these holding pawls, and dislocation when a shock is applied can be reduced.

Figure 10:
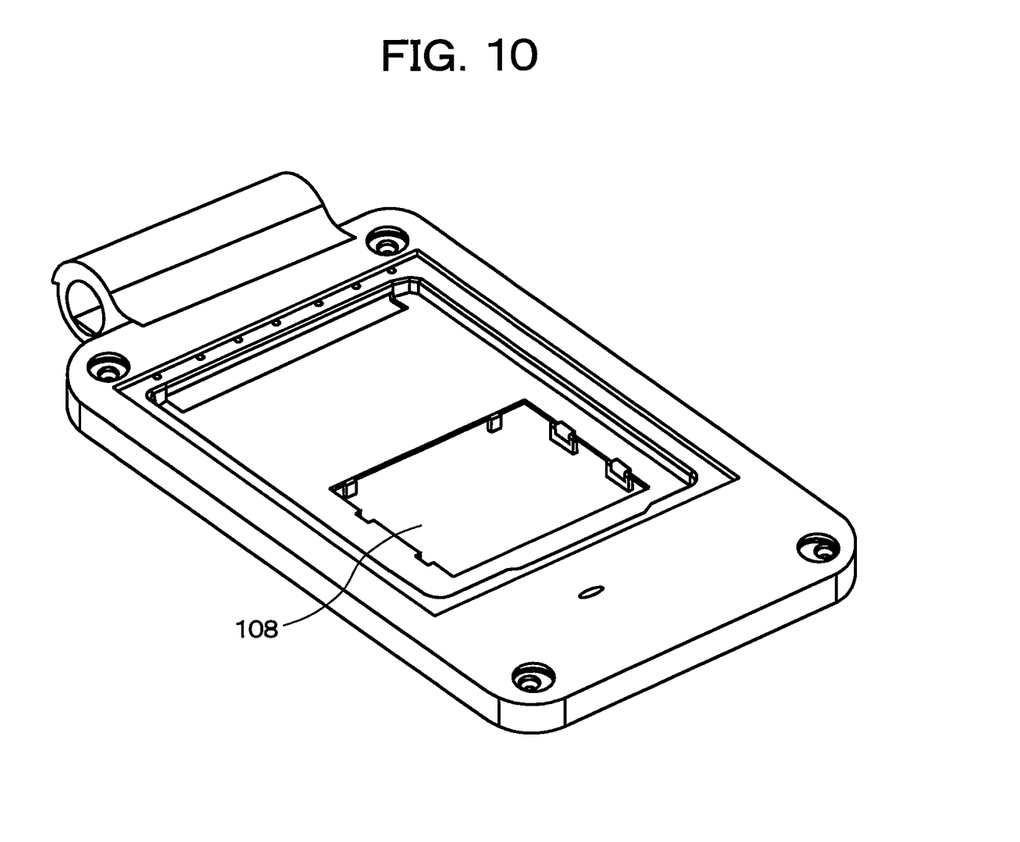
FIG. 10 is a perspective view showing the casing structure of FIG. 7 having a punched opening in the fitting member of the rear surface display unit.

FIG. 10 is similarly a device having a punched aperture 108 in the fitting member of the rear surface display unit. The thickness of the thin metal plate portion can thereby be reduced, and the thickness of the device can also be further reduced. The backlight can be shared when the main display unit and the rear surface display unit are both backlit liquid crystals.

Figure 11:
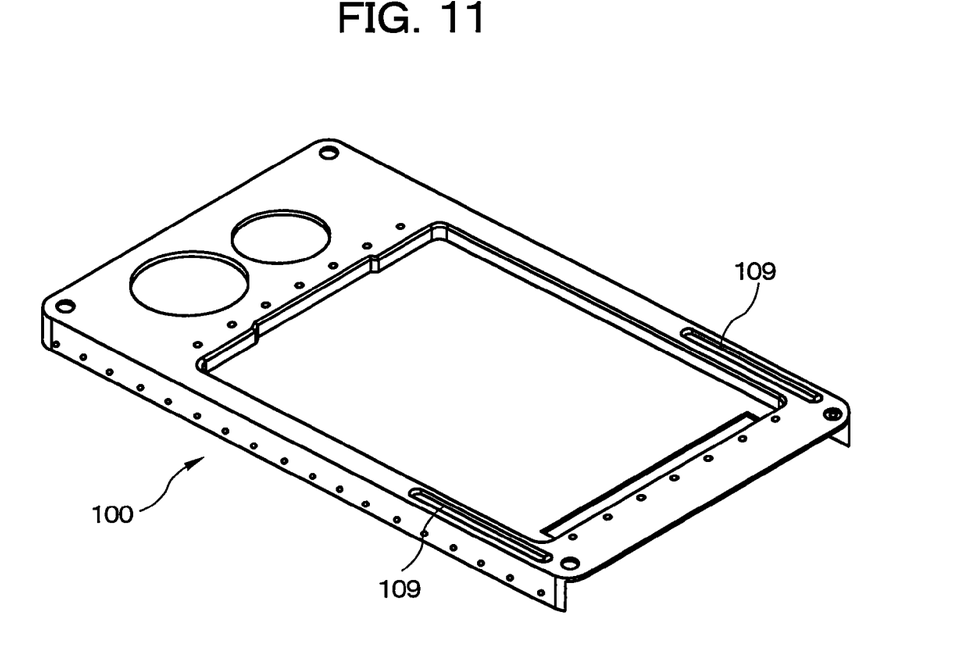
FIG. 11 is a perspective view showing the casing structure of a portable device according to a third embodiment of the present invention.

FIG. 11 is a perspective view showing the metal structure 100 of the portable device according to a third embodiment of the present invention. The overall length would be further increased in a folding portable phone, and the flexural rigidity in the lengthwise direction becomes important, but in the present invention, a drawn member 109 for strengthening the flexural rigidity of the vicinity of the hinge is provided according to the present embodiment to the hinge part where the strongest loads are applied. This drawn member 109 is drawn so as to provide a cross section that is U shaped. The rigidity in the vicinity of the hinge, which sustains the load when the device falls or at other times, can thereby be increased, and a balance in the overall rigidity can be achieved.

Figure 12:
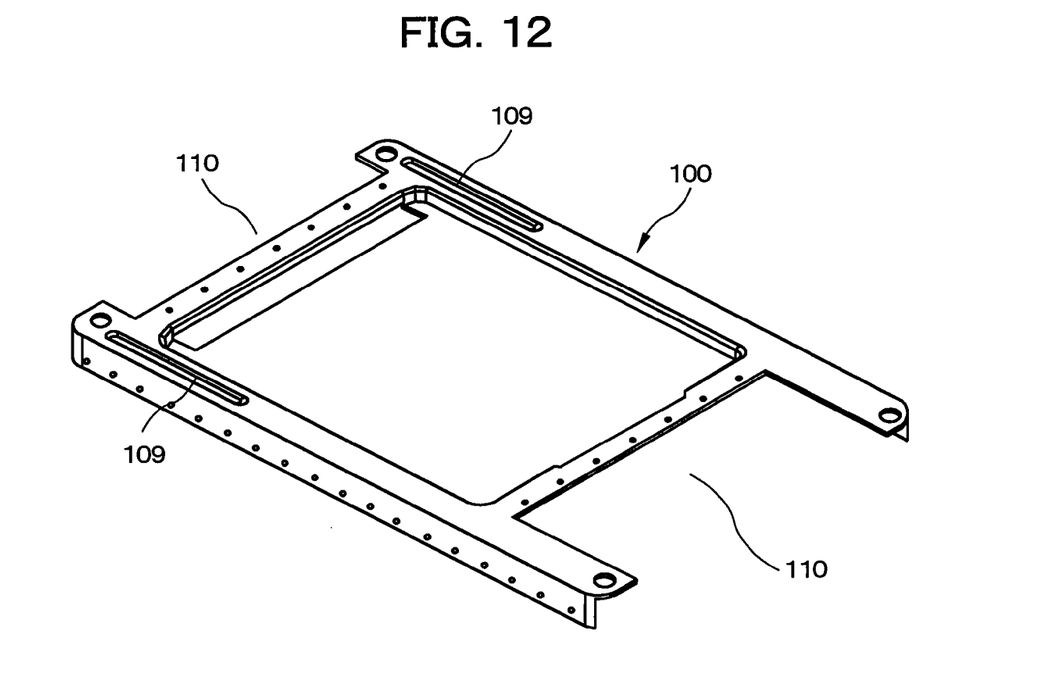
FIG. 12 is a perspective view showing the casing structure of a portable device according to a fourth embodiment of the present invention.

FIG. 12 is a perspective view showing the metal structure 100 of the portable device according to a fourth embodiment of the present invention. The metal structure 100 of this embodiment is one in which unnecessary portions of the metal structure 100 of the portable device of the third embodiment shown in FIG. 11 are cut away to provide a cutaway section 110, as shown in the drawing. In this manner, the metal structure 100 can still demonstrate its effect even without being present over the entire surface of the resin casing 200. The mounting area for the internal components of the device can be increased by providing the cutaway sections 110.

Figure 13:
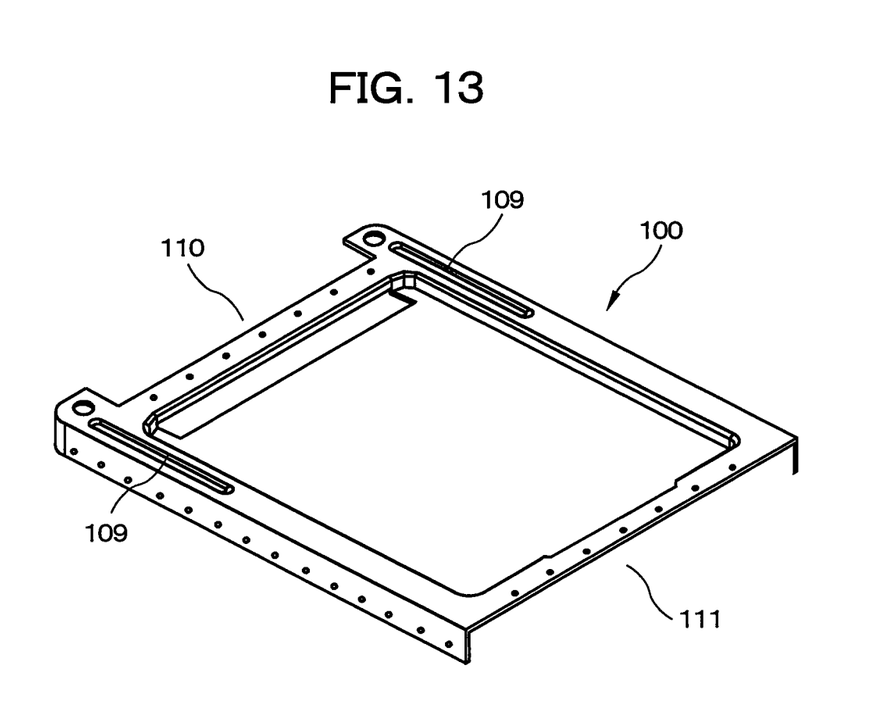
FIG. 13 is a perspective view showing the casing structure of a portable device according to a fifth embodiment of the present invention.

FIG. 13 is a perspective view showing the metal structure 100 of a portable device according to a fifth embodiment of the present invention. In present embodiment, the end portion of the metal structure 100 is severed so as to reduce the entire length of the metal structure, and a cut section 111 is provided. It is possible to secure a region without metal and a necessary antenna region in portable phones and other communication devices when the cut section 111 shown in FIG. 13 is provided. In this case, the thin metal plate is entirely removed in some areas, and the rigidity of the removed portions is therefore reduced. However, sufficient strength can be assured by maintaining the rigidity of the overall casing structure, including the rigidity of the rear cover, because the display unit portion is protected.

Figure 14:
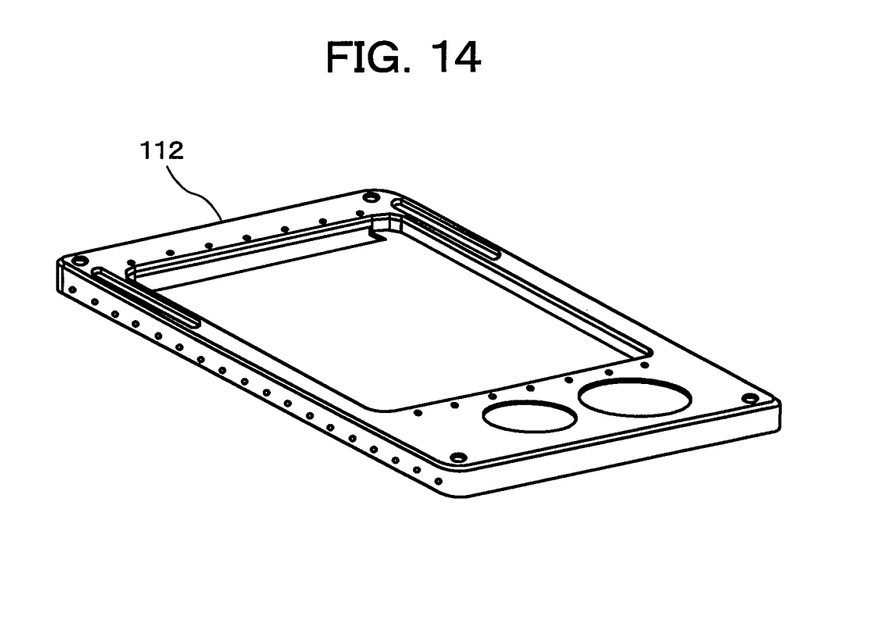
FIG. 14 is a perspective view showing the casing structure of a portable device according to sixth embodiment of the present invention.

On the other hand, strength can be increased by disposing the rib 112 in three or four side wall surfaces and making a contiguous surface. Also, this rib structure is effective when the metal structure is made even thinner, or when the drawn member as shown in the third embodiment cannot be provided.

In the present invention, a frame-shaped metal casing that is formed integrally with the metal structure by injection molding can be provided in place of the resin casing of the embodiments. In this case, the metal casing is molded by metal injection molding, which includes thixotropic molding or die-casting, and the coefficient of thermal expansion of the metal material to be molded is less than the coefficient of thermal expansion of the metal structure.

In the embodiments structured in this manner, the display unit of the portable device can be protected, the rigidity characteristics of the casing can be enhanced, and a smaller and thinner profile can be realized. In these embodiments as well, the metal structure has a rib structure along the bottomed concave-shaped part. Also, the metal structure is formed by drawing a thin metal plate, and the side wall surfaces of the bottomed concave-shaped part are contiguous. Additionally, the metal structure is formed by sintering or precision casting, including injection molding. Also, the metal casing is exposed on the exterior surface. The display unit is a backlit liquid crystal, the flat bottom surface of the bottomed concave-shaped part of the metal structure that holds the display unit of the metal structure is composed of a mirror finish section, and the mirror finish section doubles as a reflecting plate of the liquid crystal backlight. Also, the rib structure portion of the metal structure has a drawn part that is drawn into a cross-sectional concave shape.

INDUSTRIAL APPLICABILITY

The present invention can be used as the strap holder of a portable phone, a digital camera, a PDA, or another portable device.

The invention claimed is:

1. A portable device having a display unit, comprising:
   a metal plate including a recessed bottom portion and side walls cooperating with said recessed bottom portion to define a display unit receiving portion, a portion of one end of at least one of said side walls being curved to form a curved portion, and a rib structure integral with and extending outwardly from one of said side walls, said rib structure having an open u-shaped cross section;
   a display unit provided within said display unit receiving portion; and
   an injection molded frame-shaped resin casing provided on and integral with said metal plate, including said curved portion, said resin casing being provided outside and in contact with at least a portion of an outer surface of said side walls as viewed from said display unit.

2. The portable device having a display unit according to claim 1, wherein said metal plate is formed by drawing a thin metal plate and said side walls are contiguous to said recessed bottom portion and adjacent parts of said side walls are contiguous to each other.

3. The portable device having a display unit according to claim 1, wherein said metal plate is formed by sintering or precision casting, including injection molding.

4. The portable device having a display unit according to claim 1, wherein said resin casing at a hinge area and vicinity thereof is molded using highly elastic resin material.

5. The portable device having a display unit according to claim 1, wherein:
   said display unit is a backlit liquid crystal;
   said recessed bottom portion has a flat bottom surface that holds said display unit and has a mirror finish which acts as a reflecting plate of a liquid crystal backlight.

6. The portable device having a display unit according to claim 1, wherein:
   said at least one rib structure includes a plurality of rib structures which surround at least a portion of said side walls; and
   said resin casing is provided on at least a surface of said rib structures.

7. The portable device having a display unit according to claim 1, wherein said resin casing does not extend within said display unit receiving portion.

8. The portable device having a display unit according to claim 7, wherein said resin casing forms at least a portion of an exterior surface of said portable device.

9. The portable device having a display unit according to claim 1, wherein said side walls comprise two opposing walls with said display unit being positioned therebetween.

10. The portable device having a display unit according to claim 1, wherein said side walls are provided along at least a long side of said display unit.

11. The portable device having a display unit according to claim 1, wherein at least one pair of said side walls are contiguous to each other via said curved portion.

12. The portable device having a display unit according to claim 1, wherein the display unit receiving portion includes an aperture.

13. The portable device having a display unit according to claim 1, wherein at least two adjacent ends of the side walls along a contiguous shape of said side walls each include a curved portion, the curved portions each being directly in contact with said resin casing.

14. The portable device having a display unit according to claim 1, wherein each end of said side walls along a contiguous shape of said side walls includes a curved portion, said curved portions being in direct contact with said resin casing.

15. The portable device having a display unit according to claim 1, wherein said resin casing is configured in a seamless manner along the contiguous side walls.

16. A portable device having a display unit, comprising:

a metal plate including a recessed bottom portion and side walls cooperating with said recessed bottom portion to define a display unit receiving portion, a portion of one end of at least one of said side walls being curved to form a curved portion, said recessed bottom portion comprising a bottom wall;

a display unit provided within said display unit receiving portion; and an injection molded frame-shaped resin casing provided on and integral with a surface of said metal plate including said curved portion, said resin casing provided outside and being in contact with at least a portion of an outer surface of said side walls as viewed from said display unit:

at least a first of said side walls extending upwardly from said bottom wall, said first side wall having a proximal end integral with said bottom wall and a distal end located above said bottom wall;

a first plate extending from said distal end of said first side wall such that said first plate and said bottom wall extend from said first wall in opposite directions, said first plate having a first end integral with said first side wall and a second, distal end extending away from said first wall; and a second plate integral with said distal end of said first plate and extending downwardly from said distal end.

* * * * *